United States Patent [19]

Yoder

[11] 4,380,774

[45] Apr. 19, 1983

[54] HIGH-PERFORMANCE BIPOLAR MICROWAVE TRANSISTOR

[75] Inventor: Nax N. Yoder, Falls Church, Va.

[73] Assignee: The United States of America as represented by the Secretary of the Navy, Washington, D.C.

[21] Appl. No.: 217,977

[22] Filed: Dec. 19, 1980

[51] Int. Cl.³ .................. H01L 29/161; H01L 29/72; H01L 29/12

[52] U.S. Cl. ........................................ 357/34; 357/16; 357/58; 357/91

[58] Field of Search .................... 357/14, 16, 20, 34, 357/58, 89, 91

[56] References Cited

U.S. PATENT DOCUMENTS

| 3,622,842 | 11/1971 | Oberai | 317/235 R |
| 3,653,978 | 4/1972 | Robinson et al. | 148/1.5 |
| 4,007,474 | 2/1977 | Yagi et al. | 357/340 R |
| 4,151,006 | 4/1979 | DeGraaff et al. | 357/34 X |
| 4,173,763 | 11/1979 | Chang et al. | 357/34 X |
| 4,286,275 | 8/1981 | Heiblum | 357/16 X |

FOREIGN PATENT DOCUMENTS 2733146  1/1979  Fed. Rep. of Germany ........ 357/34

Primary Examiner—Martin H. Edlow
Assistant Examiner—J. Carroll
Attorney, Agent, or Firm—R. F. Beers; P. Schneider; J. G. Wynn

[57] ABSTRACT

A high-frequency transistor and method of making same wherein the parasitic capacitance between base and collector is reduced. The collector layer of GaAs is impregnated with boron ions to form an insulative region under the base contact structure thereby reducing the capacitance in this region and leaving only the region underlying the emitter structure as the active transistor region.

4 Claims, 2 Drawing Figures

4,380,774

HIGH-PERFORMANCE BIPOLAR MICROWAVE TRANSISTOR

BACKGROUND OF THE INVENTION

This invention relates to transistors and especially to bipolar transistors in which the high-frequency performance is improved by reduction of the base-collector parasitic capacitance.

Bipolar transistors are currently frequency-limited in performance primarily by base resistance, collector capacitance and transit time according to the well-known formula:

$$f = \frac{1}{4\pi \sqrt{r\,C(t_e + t_b + t_s + t_c)}}$$

where
  r is the base resistance
  C is the combination of collector-base depletion junction capacitance and collector-base parasistic capacitance
  $t_e$ is the emitter junction charging time
  $t_b$ is the base transit time
  $t_s$ is the collector-depletion-region transit time
  $t_c$ is the collector-depletion-region charging tome.

Of these factors, r, C, and $t_s$ are the largest contributors to lower performance. Imposition of the constraints of room-temperature and conventional voltage levels leaves only r and C available for significantly improving the maximum frequency of operation.

The power-added efficiency of the bipolar microwave transistor depends significantly on the emitter injection efficiency (i.e., the ratio of electron current to hole current across the forward-biased emitter-base junction). As the base resistance (r) is lowered to improve maximum frequency of response, emitter injection efficiency becomes proportional to the doping concentration in the emitter region divided by the doping concentration in the base region. This relationship is, however, accurate only for the conventional homojunction.

A method of improving this injection efficiency is to replace the conventional emitter-base homojunction with a heterojunction. In the heterojunction configuration, the emitter material is chosen to have a higher bandgap than does the base material. As such, for a given forward bias, the electron injection into the base is orders of magnitude higher than is hole injection into the emitter.

Another method of obtaining high injection efficiency is to use a tunnel injection. The effect is the same but the injection mechanism differs. Recently a phosphorus-and-oxygen-doped polycrystalline silicon emitter was shown to have high injection efficiency. This device was described as a heterojunction injection device.

The polycrystalline SIPOS emitter "heterojunction" device mentioned above may not be a heterojunction at all. A more realistic explanation is that small phosphorus-doped silicon crystallites are surrounded by silicon oxides and phosphorus oxides. These oxides are very thin (e.g., 5 Å < t < 20 Å) and, under forward bias, electrons tunnel through these oxides to the base region. Thus the operation of the device is that of tunnel injection rather than of heterojunction injection. As such, better performance would be obtained if a single crystalline base were used and if the oxide layer could be made very uniform. The problem of interface states would, unfortunately, remain.

To significantly improve the performance (i.e., maximum operating frequency and efficiency or gain), one must reduce base resistance, improve injection efficiency, reduce base-to-collector capacitance, and decrease delay times. In conventional homojunction devices, the first two objectives are not simultaneously achievable. The r-C time constant must be reduced for better microwave performance. In order to avoid impairing injection efficiency when reducing r, a non-homojunction approach must be used. Previous non-homojunction approaches have been effective in simultaneously reducing r while keeping injection efficiency very high, but have suffered by introducing interface states (i.e., electron and/or hole traps) in the metallurgical region between the emitter and base junction. Various schemes have proposed using an AlGaAs emitter on a GaAs base but these approaches (while eliminating interface states) create a problem in making good ohmic contact to the high-bandgap AlGaAs emitter material.

The present invention approaches the problem of improving high-frequency performance from the point of view of decreasing the parasitic capacitance between base and collector of the bipolar transistor.

SUMMARY OF THE INVENTION

An object of this invention is to reduce parasitic base-collector capacitance of a bipolar transistor.

Another object is to improve the high-frequency performance of a bipolar transistor.

These and other objects are accomplished in a transistor which has an emitter structure overlying the base and collector layers and a base contact structure also overlying the base and collector layers but spaced from the emitter structure. The collector layer underneath the base contact structure and a portion of the emitter structure is implanted with boron ions before the emitter and base contact structures are formed so that the collector layer becomes insulative in these regions and the active transistor region only exists under the emitter structure.

DETAILED DESCRIPTION OF THE INVENTION

Figure 1:
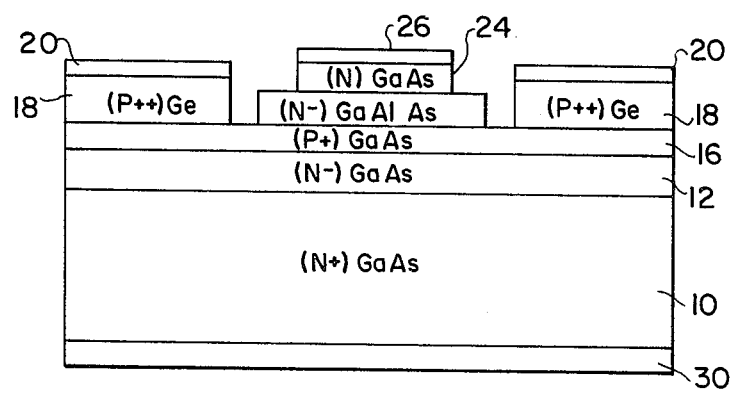
FIG. 1 is a schematic side view of the layers of a GaAs bipolar transistor.
Figure 2:
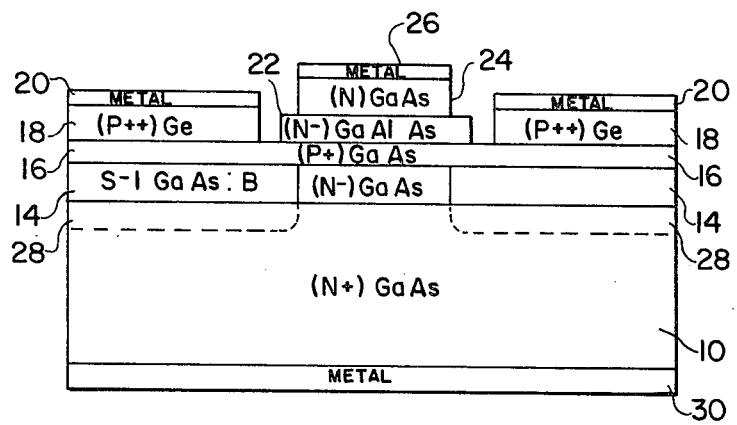
FIG. 2 is a schematic side view of the transistor of FIG. 1 after treatment in accordance with this invention.

FIG. 1 shows the structure of a conventional GaAs bipolar transistor. FIG. 2 shows an improved GaAs bipolar transistor according to the present invention wherein portion(s) of its collector layer are impregnated with boron-ions to form a semi-insulative region(s) under the base contact structure(s). As previously mentioned, this technique lowers the parasitic capacitance between the base layer and the collector layer.

Referring then to FIGS. 1 and 2, as viewed concurrently, starting from a Ge-doped (N+)(e.g., $1\times10^{18}/cm^3$) GaAs substrate 10, an (N−) (e.g., $1\times10^{16}/cm^3$) layer 12 is grown to a nominal thickness of about 2 micrometers (the exact thickness is dependent upon desired operating voltage and $f_{max}$ and is chosen in the conventional manner). The center portion of this layer 12 (see FIG. 2) becomes the depleted collector region of the transistor. The outer regions 14 of layer 12 are next implanted with boron ions to a uniform concentration exceeding the original donor level of the layer 12 (e.g., $>1\times10^{16}/cm^3$). This action compensates the donors as a result of creating As vacancies by virtue of negligible ionic bonding between B and As. The area of layer 12 not implanted with boron determines the cross-section of the active transistor and is chosen in the conventional manner dependent on the current-handling capability desired of the transistor. The periphery-to-area ratio of this section is not critical as in conventional transistor design because the boron-implanted regions are rendered semi-insulating by the fabrication technique used such that the parasitic base-to-collector capacitance is significantly less than the collector depletion capacitance. This is in marked contrast to conventional designs wherein parasitic capacitance is greater than collector depletion capacitance. This parasitic capacitance can be virtually eliminated if high-energy (e.g., >2 MeV) ion-implant capability is available such that boron implantation in the GaAs collector layer can be made deeper than the nominal 2-micrometer depth of the (N−) layer (12 and 14), as shown by the dotted portion 28 of FIG. 2.

The wafer is next annealed for 30 minutes at 750 degrees C. so as to render the boron-implanted region semi-insulating. Annealing in flowing arsine gas is preferred to preserve the stoichiometry of the surface. Other conventional methods are acceptable if surface stoichiometry is rejuvenated by chemical etch or other conventional procedures.

The (P+) layer 16 is next grown. Magnesium doping is preferred over zinc, for example, so that diffusion of the acceptor into the underlying region is reduced. If low-temperature growth techniques are used (such as in molecular beam epitaxy), this Zn prohibition requirement is relaxed.

Layer 18 is next grown from Ge evaporated on the substrate held at 285 degrees C. in an ultra-high-vacuum evaporator back-filled with $10^{-7}$ Torr of Ga or In vapor pressure. This creates a degenerate (P++) Ge region of low bandgap material on which to later place a non-alloyed tunnelling contact.

The Ge is next etched away from the region over the underlying (N−) GaAs region by the use of conventional differential chemical etches. $SiO_2$ is used to isolate the non-active regions.

Region 22 is then grown epitaxially of (N−) doped GaAlAs to a nominal thickness of 20 Å. This requires the use of molecular beam epitaxy or metal-organic chemical vapor deposition techniques to obtain thickness control and to eliminate interface states. This GaAlAs region 22 becomes the tunnel barrier of the emitter structure, which comprises the metal layer 26 and the N-type GaAs layer 24. The mole fraction cation ratio should be greater than 60% Al, but less than 85% Al. While pin-holes in this layer are to be avoided, their presence as a small (e.g., <5%) fraction of the area will not significantly affect the performance of the device.

Region 24 which is part of the emitter structure is next grown epitaxially on top of the AlGaAs. It is of Ge or Si-doped GaAs and may be grown by any number of conventional epitaxial techniques, but a continuation of the method used to grow layer 22 is recommended to avoid exposure to the atmosphere and resultant contamination of the surface and introduction of interface states. Its thickness should exceed 1000 Å.

Region 26 (which is part of the emitter structure) and region 30 are conventional ohmic contacts to N-type GaAs exhibiting specific contact resistivities less than $10^{-6}$ ohm-cm². While tunnelling contacts through intermediate (not shown) As-doped Ge layers are preferred, standard Au-Ge-Ni contacts are acceptable. Region 20 is any metal layer and it forms a tunnelling contact to the degenerately doped Ge layer 18. Regions 20 and 18 are the base contact structure.

In operation, regions 24 and 26 act as the emitter. Injection of electrons to the base region 16 is via tunnelling currents through insulating region 22. Energy levels are such that the probability of hole-tunnelling from base to emitter is low (e.g., <5%). Pin holes in the GaAlAs barrier 22 increase hole current and are to be avoided as much as possible. Tunnelling through the GaAlAs inhibits breakdown of this thin semiconductor region.

Tunnel injection through the interface between layers 20 and 18 combined with the ohmic nature of the interface between layers 18 and 16 form the ohmic contact to base region 16. The base contact structure 20 and 18 can be formed in a circle (as viewed from above) or may be in the form of two strips which comprise separate contacts to the base layer 16.

Minority carrier diffusion through the P-type base region 16 is similar to that of a conventional transistor. The base region can, however, be made thinner than that of a conventional transistor as it can be doped much more heavily without sacrificing injection efficiency. As it is thinner, minority carrier lifetime is no longer of great importance since the electrons reach the collector before they recombine with holes. An advantage, in fact, accrues in the use of GaAs in the transistor in that excess charge stored on the base side of the AlGaAs (there is negligible excess charge on the emitter side because of the high injection efficiency) has a much shorter lifetime than it does in silicon, thus further contributing to higher-frequency operation.

Collector operation is similar to that of conventional transistors except that the boron implant to create a semi-insulating region between collector and inactive base region reduces parasitic capacitance to the point where it no longer plays a dominant role in device operation.

The device operates in a tunnel injection mode, eliminates interface states, maintains high injection efficiency with low base resistance, provides low ohmic contact resistance, and greatly reduces base-collector capacitance. It also introduces a new factor in device fabrication, i.e., the judicious choice of impurities to selectively effect the overall crystal ionicity and thereby influence the reliability and electrical characteristics of the semiconductor.

It is obvious, of course, that other materials can be used for the various layers of the device and the formation of the semi-insulative region in the collector can be accomplished by ion implantation or other methods, such as diffusion. The material used to form the semi-insulator would depend on the material used in the collector layer. What is important is to form a semi-insulating collector region under the base contact structure so that the active transistor region is restricted to that area underlying the emitter structure.

Obviously, many modifications and variations of the present invention are possible in light of the above teachings. It is therefore to be understood that, within the scope of the appended claims, the invention may be practiced otherwise than as specifically described.

What is claimed is:

1. An improved bipolar transistor of the type having a collector layer lying on one side of a substrate and an ohmic contact lying on the other side thereof, a base layer lying on the collector layer, an emitter structure including a tunnel barrier layer lying on a center region of the base layer, an emitter layer lying on the tunnel barrier layer and another ohmic contact lying on the emitter layer, and a base contact structure including a contact layer lying on outer regions of the base layer and a metal layer lying on the contact layer, the emitter and base contact structures being spaced from each other, wherein the improvement comprises:

forming a semi-insulative region in the collector layer underlying the base contact structure, so that the region through which charge carriers travel from the emitter structure through the base layer into the collector layer is restricted substantially to the center region of the base layer underlying the tunnel barrier layer of the emitter structure.

2. The improved bipolar transistor of claim 1 wherein the collector layer is formed from GaAs, and the semi-insulative region in the collector layer is formed by implanting and subsequently annealing the collector layer underlying the base contact structure with boron-ions to a predetermined density.

3. The improved bipolar transistor of claim 2 wherein the predetermined density of the boron-ions is at least $1 \times 10^{16}/cm^3$.

4. The improved bipolar transistor of claim 3 wherein the semi-insulative region is deeper than the depth of the collector layer and extends into the one side of the underlying substrate.

* * * * *